US006453187B1

(12) United States Patent
Prince et al.

(10) Patent No.: US 6,453,187 B1
(45) Date of Patent: Sep. 17, 2002

(54) METHOD OF EMPLOYING ANGLE IMAGES FOR MEASURING OBJECT MOTION IN TAGGED MAGNETIC RESONANCE IMAGING

(75) Inventors: Jerry L. Prince, Lutherville; Nael F. Osman, Baltimore, both of MD (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 09/131,589

(22) Filed: Aug. 10, 1998

(51) Int. Cl.[7] ............................................. A61B 5/055
(52) U.S. Cl. ...................... 600/410; 324/309; 128/922
(58) Field of Search .............................. 600/410, 413; 324/307, 309; 128/920, 922

(56) References Cited

U.S. PATENT DOCUMENTS

| | | |
|---|---|---|
| 5,054,489 A | 10/1991 | Axel et al. |
| 5,111,820 A | 5/1992 | Axel et al. |
| 5,217,016 A | 6/1993 | Axel et al. |
| 5,275,163 A | 1/1994 | McKinnon et al. |
| 5,281,914 A | 1/1994 | Conturo et al. |
| 5,315,248 A | 5/1994 | Yamaguchi |
| 5,352,979 A | 10/1994 | Conturo |
| 5,379,766 A | 1/1995 | McKinnon et al. |
| 5,512,825 A | 4/1996 | Atalar et al. |
| 5,545,993 A | 8/1996 | Taguchi et al. |

OTHER PUBLICATIONS

N. Osman et al., Direct Calculation of 2D Components of Myocardial Strain Using Sinusoidal MR Tagging, in Proceedings of SPIE's International Symposium on Medical Imaging, 1988, (San Diego, USA).

C. Moore et al., Calculation of Three–Dimensional Left Ventricular Strains From Biplanar Tagged MR Images, Journal of Mag. Res. Imaging, Mar./Apr. 1992, vol. 2, pp. 165–175.

Prince et al., Motion Estimation From Tagged MR Image Sequences, IEEE Trans. on Medical Imaging, Jun. 1992, vol. 11, No. 2, pp. 238–249.

*Primary Examiner*—Ruth S. Smith
(74) *Attorney, Agent, or Firm*—McKenna & Cuneo, LLP

(57) ABSTRACT

A method of measuring motion of an object by magnetic resonance imaging including applying a pulse sequence to spatially modulate a region of interest of said object. At least one spectral peak is acquired from the Fourier domain of the spatially modulated object. The inverse Fourier transform information of the acquired spectral peaks is computed. The angle images are computed from the spectral peak. The angle images employed to measure motion of the object. The method may employ a SPAMM pulse sequence as the pulse sequence. The angle images may be employed to compute directly and automatically, planar strain in two dimensions or a full strain tensor in three dimension. The data may be useful in detection and quantification of myocardial ischemia and infarction. The angle images may also be employed to generate data equivalent to planar tag data automatically and can be employed to generate any desired tag separations. The angle images may also be employed to compute displacement, synthesize tag patterns and compute optical flow without requiring the use of regularization.

36 Claims, 8 Drawing Sheets

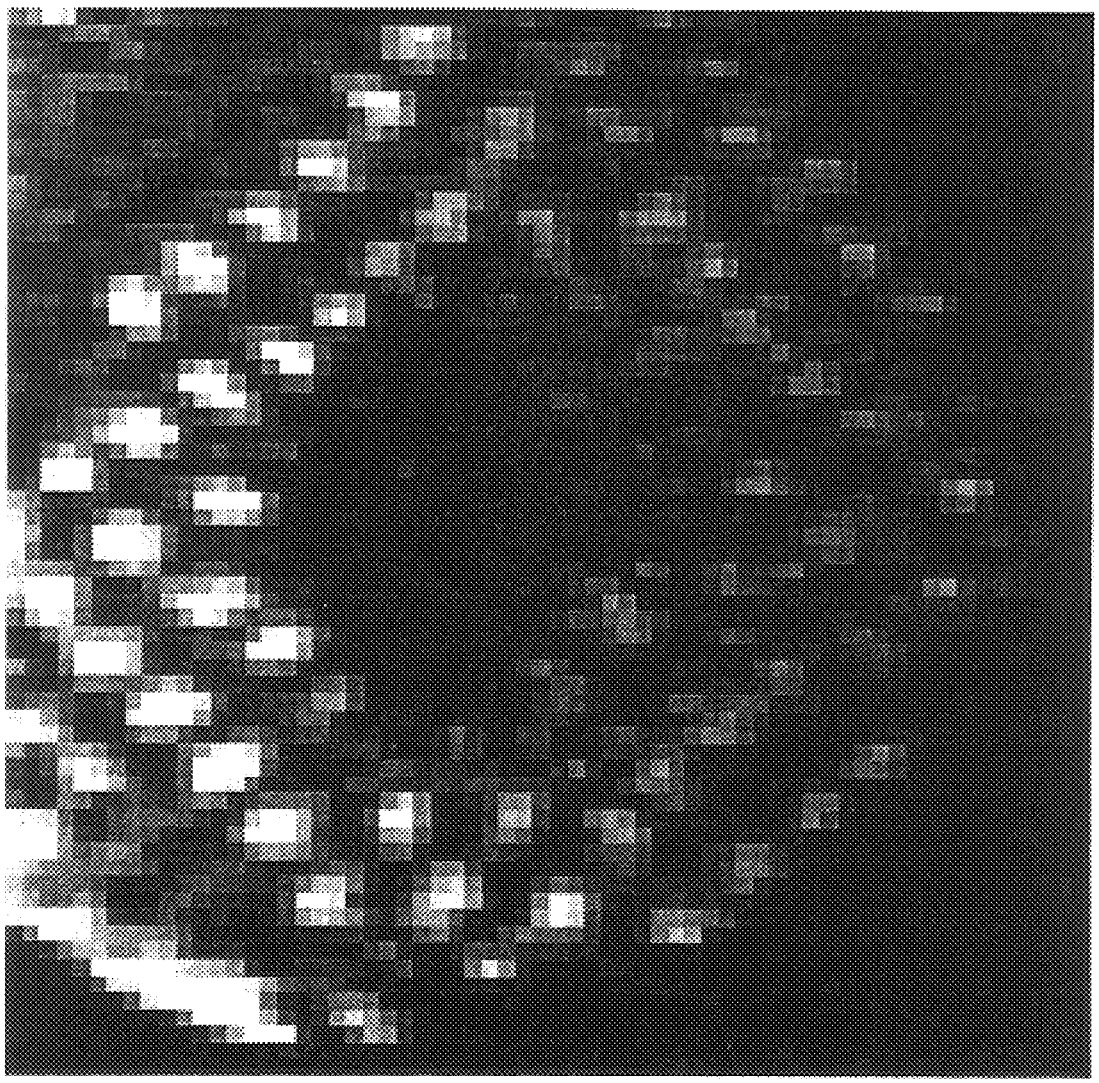
Figure 7.a

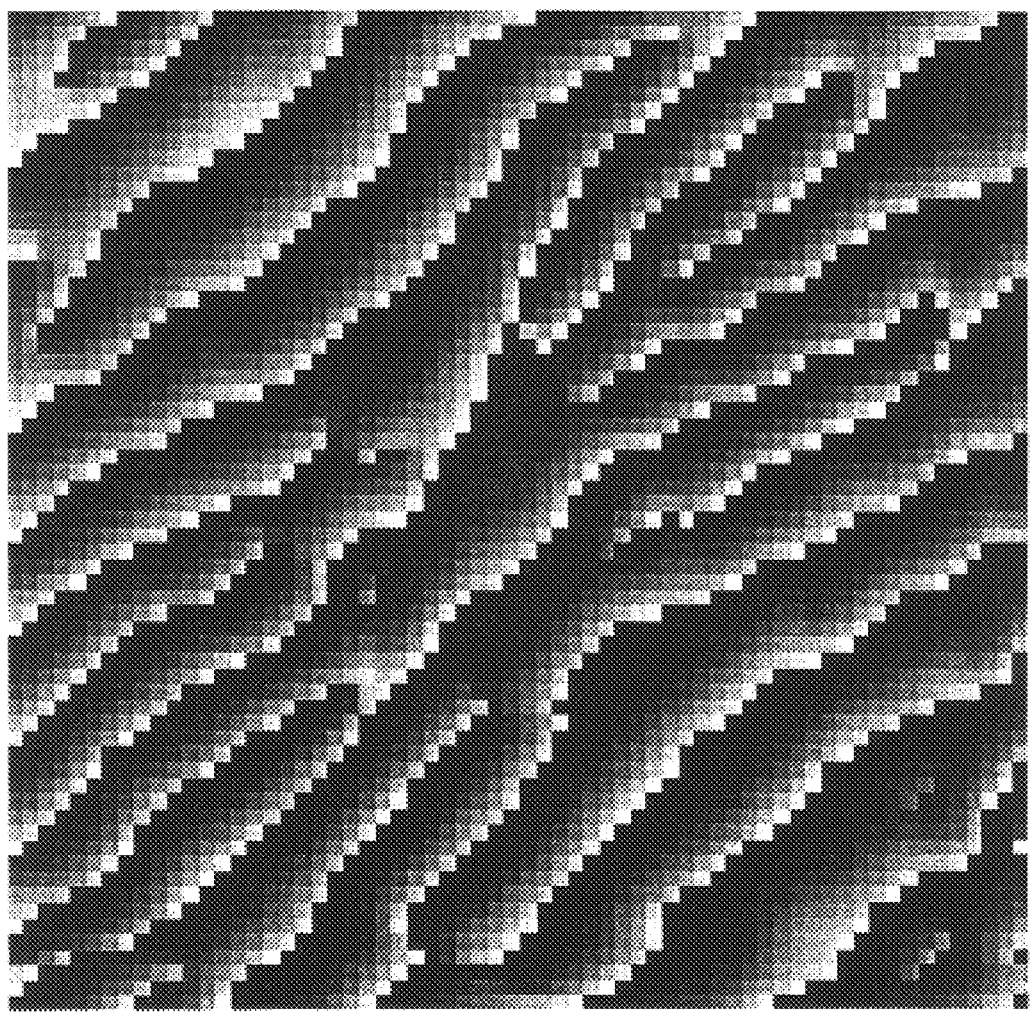
Figure 7.b

METHOD OF EMPLOYING ANGLE IMAGES FOR MEASURING OBJECT MOTION IN TAGGED MAGNETIC RESONANCE IMAGING

GOVERNMENT SUPPORT

The present invention was supported at least in part by NIH Grant No. 5 R29 HL47405-04 and NSF Grant No. MIP9350336.

BACKGROUND OF THE INVENTION

1. Field of the Invention

The present invention provides a method for employing tagged magnetic resonance imaging and associated angle images for determining two-dimensional or three-dimensional strain, small displacements, creating synthetic tag lines and optical flow processing.

2. Description of the Prior Art

The advantageous use of magnetic resonance imaging wherein a patient or object is placed within a magnetic field with alternating generation of RF pulses and gradient pulses serving to excite nuclei within the area of interest and cause responsive emission of magnetic energy which is picked up by a receiver and may be processed by computer means followed by recording, display or production of hard copy of the results has long been known. See, generally, Atalar-McVeigh U.S. Pat. No. 5,512,825 and Conturo-Robinson U.S. Pat. No. 5,281,914, both of which are assigned to the owner of the present invention, the disclosures of which are expressly incorporated herein by reference.

It has been known to employ two sets of tagging planes oriented orthogonal to the image plane in imaging two-dimensional heart wall motion with magnetic resonance imaging through spatial modulation of magnetization (SPAMM) approaches. See U.S. Pat. Nos. 5,054,489, 5,111,820 and 5,217,016. See also, Axel et al., MR Imaging of Motion with Spatial Modulation of Magnetization, Radiology, 171:841–845, 1989 and Axel et al, Heart Wall Motion: Improved Method of Spatial Modulation of Magnetization for MR Imaging, Radiology, 172(1):349–350, 1989.

It has been known in connection with magnetic resonance tagging to employ image processing techniques to detect tag features and subsequently combine the features into a detailed motion map related to displacement and strain with subsequent interpolation being employed. See, for example, Young et al., Three-Dimensional Motion and Deformation with Spatial Modulation of Magnetization, Radiology, 185:241–247, 1992 and McVeigh et al, Noninvasive Measurements of Transmural Gradients in Myocardial Strain with MR Imaging, Radiology, 180(3):677–683, 1991. These approaches are not automated as they require some manual intervention.

It has also been known to employ optical flow methods in respect of magnetic resonance tagging image sequences. See, generally, Prince et al., Motion Estimation from Tagged MR Image Sequences, IEEE Trans. on Medical Imaging, 11(2):238–249, June 1992, Gupta et al., On Variable Brightness Optical Flow for Tagged MRI, Technical Report, 95-13, JHU/ECE, 1995, and Gupta et al., Bandpass Optical Flow for Tagged MR Imaging, Proceedings of the IEEE International Conf. on Image Proc., Santa Barbara, 1997. In such approaches sinusoidal tag patterns are employed instead of saturated planes. Image brightness gradients are features which together with temporal derivatives estimated from image pairs can be used to provide dense motion estimates generally referred to as "optical flow." Such approaches require regularization to compensate for the fact that the brightness gradients contain information about motion solely in the direction of the gradient.

U.S. Pat. No. 5,275,163 discloses the use of magnetic resonance imaging in monitoring motion of a part of an object. Pulse and gradient sequences are applied in pairs with spatially differing tagging patterns and subtraction being employed to form a tagged image.

U.S. Pat. No. 5,352,979 discloses observing a phase angle response of volume elements in a slice or volume and imaging occurring before and during perturbations caused by external stimuli.

U.S. Pat. No. 5,379,766 discloses quantitative motion evaluation of a portion of an object by employing a high contrast tagging grid for detection of tagging patterns. U.S. Pat. Nos. 5,315,248 and 5,545,993 disclose tracking of motion.

It has been known to employ planar tag analysis in magnetic resonance imaging. It has also been known to employ such approaches in connection with the analysis of myocardial motion. Such prior art methods typically involve extraction of motion from these images through displacement vectors or strain patterns and involve tag identification and position estimation followed by interpolation.

Phase contrast magnetic resonance imaging has also been known. It provides a method for directly measuring motion by measuring a property sensitive to velocity and reconstructing velocity fields with strain being computed by employing finite differences. One of the problems with these two approaches is that planar tagging images cannot be accurately analyzed automatically. Phase contrast images, while capable of being analyzed automatically, tend to have a low signal-to-noise ratio leading to unacceptable results.

In spite of the foregoing known systems, there is lacking an effective means for employing magnetic resonance imaging systems to compute strain directly in either as planar strain or three-dimensional strain tensors automatically and with great accuracy. There is also lacking the ability to employ optical flow calculations without regularization as employed in conventional optical flow.

SUMMARY OF THE INVENTION

The term "angle image" as employed herein refers to the phase of an image corresponding to an isolated spectral peak in a SPAMM-tagged magnetic resonance image.

The above-described need has been met by the present invention. A method of measuring motion of an object by magnetic resonance imaging including applying a pulse sequence to spatially modulate a region of interest of said object. At least one spectral peak is acquired from the Fourier domain of the spatially modulated object. The inverse Fourier transform information of the acquired spectral peaks is computed. The angle images are computed from the spectral peaks. The angle images are employed to measure motion of the object.

The method may employ a SPAMM pulse sequence as the pulse sequence.

The invention may also be employed to determine small displacements, create synthetic tag lines and facilitate optical flow processing.

The invention is particularly suited to use on a heart and may be employed to evaluate myocardial ischemia and myocardial infarctions in terms of both detection and quantification.

It is an object of the present invention to provide an improved method for rapid and accurate visualization of motion of an object using tagged magnetic resonance images of an object.

It is another object of the present invention to provide such a method which employs isolated spectral peaks in SPAMM-tagged magnetic resonance images.

It is an object of the present invention to provide an improved means for employing two-dimensional or three-dimensional 1-1 SPAMM tag patterns in magnetic resonance imaging measurement of motion of an object.

It is a further object of the present invention to provide such a system wherein angle images are acquired from two or more spectral peaks of the Fourier transform information and are employed to provide planar strain or tensor strain computations.

It is a further object of the present invention wherein angle images may be employed to make such computations automatically and rapidly.

It is another object of the present invention to use the method to detect small displacements, create synthetic tag lines and to facilitate optical flow processing without regularization.

It is a further object of the present invention to generate such angle images automatically.

It is yet another object of the present invention to produce angle images directly from the Fourier data without requiring production of conventional magnetic resonance images.

These and other objects of the invention will be more fully understood from the following description of the invention on reference to the illustrations appended hereto.

BRIEF DESCRIPTION OF THE DRAWINGS

FIG. 7a is a cross-section of a left ventricle with 1-1 SPAMM tags.

FIG. 7b is the angle image of FIG. 7a.

DESCRIPTION OF THE PREFERRED EMBODIMENTS

Figure 1:
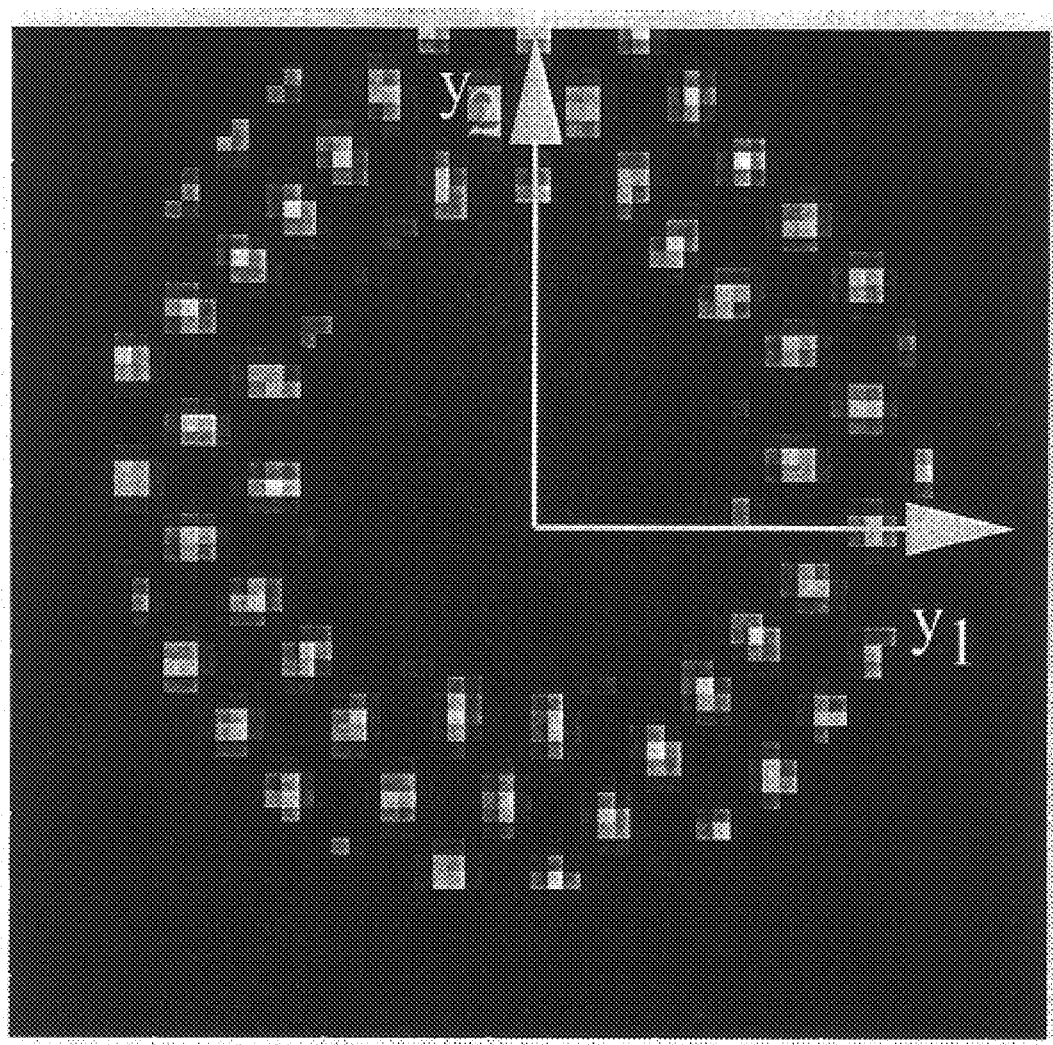
FIG. 1 illustrates a simulated two-dimensional 1-1 SPAMM tagged image.

As employed herein, the term "patient" means a living member of the animal kingdom including human beings.

As employed herein, the term "object" includes patients and any other items, as well as portions thereof, being monitored for movement by methods of the present invention. Among the medical uses are use in measuring motion of the heart wall, muscles and tendons. The object being monitored may be a fluid, such as blood or cerebrospinal fluid, for example, or a solid or semi-solid, or combinations thereof.

Tagged magnetic resonance imaging (MRI) is rapidly becoming a standard approach to the detection and monitoring of heart motion defects caused by ischemia or infarction. See E. A. Zerhouni et al., Human Heart: Tagging with MR Imaging—A Method for Noninvasive Assessment of Myocardial Motion, Radiology, Vol. 169, No. 1, pp. 59–63, 1988; E. R. McVeigh et al., Noninvasive Measurements of Transmural Gradients in Myocardial Strain With MR Imaging, Radiology, Vol. 180, No. 3, pp. 677–683, 1991; and C. Moore et al., Calculation of Three-Dimensional Left Ventricular Strains from Biplanar Tagged MR Images, Journal of Mag. Res. Imaging, Vol. 2, pp. 165–175, Mar/Apr 1992. Tagged MRI uses an MR scanner to temporarily change the magnetic properties of tissues in and around the heart in a pre-specified pattern, which can then be imaged as both the heart and the pattern undergo deformation. Analysis of the deformed patterns in the resulting image sequence yields information about the motion of the heart muscle within its walls. Image analysis is usually done using feature extraction methods, although optical flow methods have also been explored. See, also, S. E. Fischer et al., True Myocardial Motion Tracking, Mag. Res. in Medicine, Vol, 31, pp. 401–413, 1994; T. S. Denney et al., Reconstruction of 3-D Left Ventricular Motion from Planar Tagged Cardiac MR Images: An Estimation Theoretic Approach, IEEE. Trans. Med. Imag., Vol. 14, No. 4, pp. 625–635, 1995; J. Prince et al., Motion Estimation from Tagged MR Image Sequences, IEEE Trans. on Medical Imaging, Vol. 11, pp. 238–249, June 1992; S. C. Amartur et al., A New Approach to Study Cardiac Motion: The Optical Flow of Cine MR Images, Mag. Res. Med., Vol. 29, No. 1, pp. 59–67, 1993; and S. N. Gupta et al., Bandpass Optical Flow for Tagged MR Imaging, in the Proceedings of the IEEE International Conf. on Image Proc., Vol. 3, pp. 364–367, (Santa Barbara), 1997.

A dense estimate of planar strain can be formed directly from SPAMM-tagged images without using conventional feature extraction or optical flow methods. See N. Osman et al., Direct Calculation of 2D Components of Myocardial Strain Using Sinusoidal MR Tagging, in Proceedings of SPIE's International Symposium on Medical Imaging, (San Diego, USA), 1998; L. Axel et al., MR Imaging of Motion with Spatial Modulation of Magnetization, Radiology, Vol. 171, pp. 841–845, 1989; and L. Axel et al, Heart Wall Motion: Improved Method of Spatial Modulation of Magnetization for MR Imaging, Radiology, Vol. 172, No. 1, pp. 349–350, 1989. This approach relies on a signal model for SPAMM patterns and the interpretation of motion as an angle modulation of the underlying carrier frequencies. The present invention creates angle images which can be useful directly in estimating very small displacements,(such as error displacements), synthesizing tag lines and computing optical flow.

SPAMM-tagged magnetic resonance images have a collection of distinct spectral peaks in the Fourier domain. Each spectral peak contains information about the motion in a specific direction. The inverse Fourier transform of one of these peaks, extracted as by using a bandpass filter, is a complex image whose phase is linearly related to a directional component of the actual motion. This phase image is the "angle image" defined hereinbefore. It is constrained to lie in the [-π, π) range (by the action of the standard inverse arctangent operator.) This is the angle wrapping artifact. Even though an angle-wrapping artifact exists, the angle image can be employed to synthesize tag patterns, and pairs of angle images can be employed to measure small displacement fields, optical flow between image pairs without requiring regularization, as well as two-dimensional and three-dimensional strain.

The heart is repeatedly tagged at end-diastole using a two-dimensional or three-dimensional 1-1 SPAMM tag pattern. The tagging pulse sequences are imposed at the end-diastole which is the portion of the cardiac cycle wherein the left ventricle is full of blood and the heart is relatively slow-moving and the QRS complex of the ECG signals is present. For purposes of evaluation, the end-diastole can be considered a time when t=0 and the position of the points within the heart at end-diastole can be treated as a material coordinate system. During successive cardiac cycles, k-space is scanned using a standard steady-state gradient echo imaging pulse sequence to acquire the Fourier transform information encompassing at least one of the nine dominant spectral lobes in Fourier space. If more than one spectral peak is imaged, a bandpass filter is applied to extract only the information in one peak. The inverse Fourier transform of this data is taken without performing a conjugate symmetry operation. It is customary in MR imaging to perform a conjugate symmetry operation. The complex angle of the resulting complex image forms an angle image.

It will be appreciated that in lieu of employing scanning by gradient echo magnetic resonance imaging, alternate known means, such as spin echo, spiral magnetic, or echo planar magnetic resonance imaging may be employed, for example.

Figure 2:
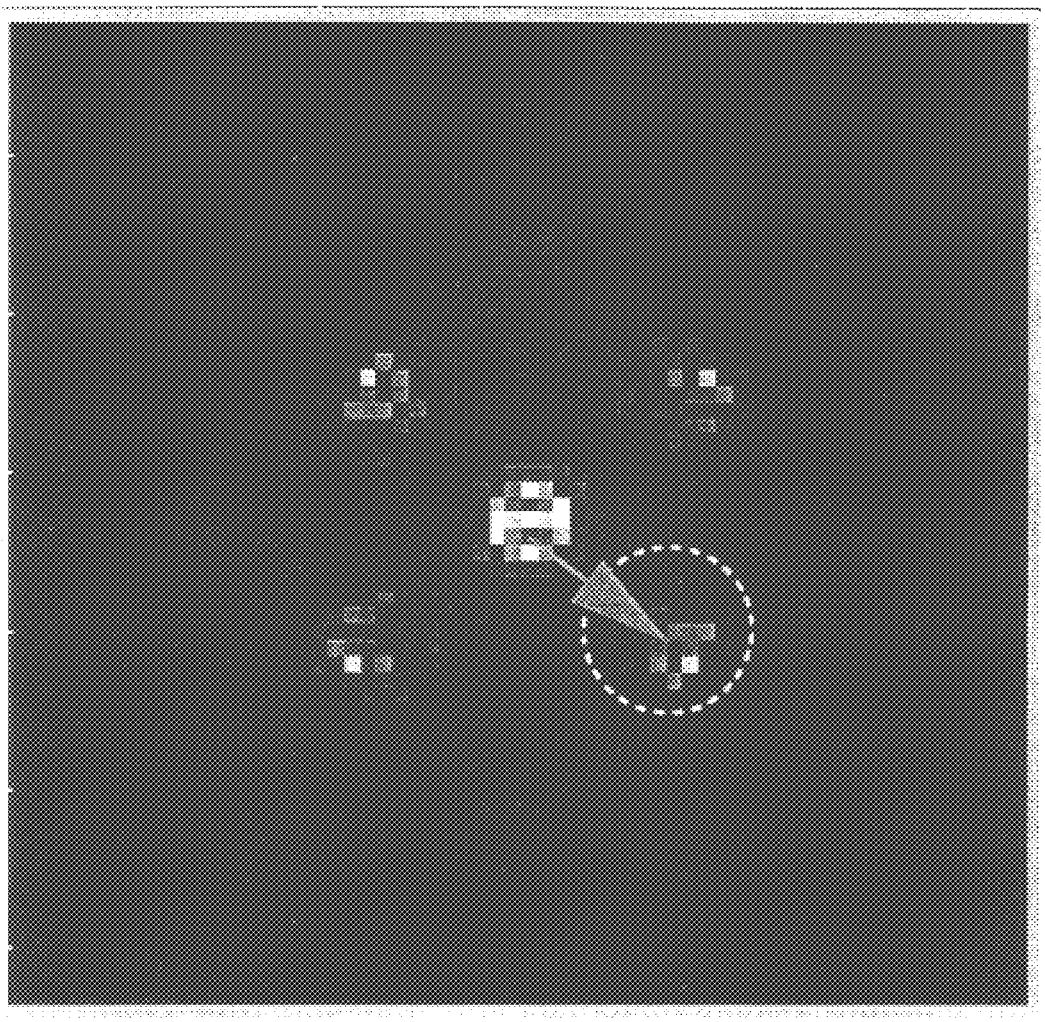
FIG. 2 illustrates the magnitude of the Fourier transform of the image of FIG. 1.

A one-dimensional 1-1 SPAMM tag pattern may be generated by applying an α-degree pulse followed by an applied transverse gradient pulse which is within the image plane followed by another α-degree pulse with completion of the tag pattern being a crusher gradient which eliminates coherent lateral magnetization. The 1D1-1 SPAMM pattern is the sum of three complex images each occurring at different frequencies and resulting in the existence of three spectral peaks in the Fourier transform of the 1D 1-1 SPAMM-tagged image. A two-dimensional 1-1 SPAMM pattern may be created by applying two 1D1-1 SPAMM sequences in rapid succession. This results in the 2D 1-1 SPAMM-tagged image being the sum of 9 complex images which result in 9 spectral peaks in such an image. A three-dimensional 1-1 SPAMM pattern may be created by applying three 1D1-1 SPAMM pulse sequences in rapid succession. This results in the 3D 1-1 SPAMM tagged image being the sum of 27 complex images which results in 27 spectral peaks in the Fourier domain of such an image. In general, the number of the complex images and the spectral peaks in a tagged image depends on the number and properties of the SPAMM pulse sequence. A synthetic or simulated 2D 1-1 SPAMM pattern, which has been applied to a ring-shaped object is shown in FIG. 1 and the magnitude of its Fourier domain is shown in FIG. 2 showing the 9 spectral peaks.

The existence of these spectral peaks can be understood in the context of the tagging process providing a carrier harmonic which spatially amplitude modulates the image, thereby causing a shift of its corresponding spectral peak to the position of the carrier harmonic.

To put this in mathematical context, a tagged MR image taken at time can be represented by $\psi(y,t)$ which gives the intensity value at any point $y=[y_1 y_2]$ in the image plane, where $y_1$ is the read-out direction, and $Y_2$ is the phase encoding direction. Because of the existence of spectral peaks the image $\psi(y,t)$ can be written as a summation $$\psi(y,t) = \sum_{k=-K}^{K} \psi_k(y,t) \tag{1}$$

wherein each image $\psi_k(y,t)$ is an image corresponding to a spectral peak. The integer k is an ID for a spectral peak. The location of the spectral peak is determined by the vector $w_k=[W_{1k}\ W_{2k}\ W_{3k}]^T$ which can be determined by the SPAMM pulse sequence. The total number of spectral peaks is 2K+1. Its value depends on the number and properties of the SPAMM pulse sequences.

The image $\psi_k$ is a complex image, i.e., has a magnitude ($D_k$) and phase ($\phi_k$) so that $$\psi_k(y,t)=D_k(y,t)e^{j\phi_k(y,t)}, k=-K,\ldots,K \tag{2}$$

Under appropriate conditions, such as tags separation, ok can be extracted from VI using bandpass filters.

The angle images may be computed from the complex image $\phi_k$ using $$a_k(y,t)=\angle\psi_k(y,t), k=-K,\ldots,K \tag{3}$$

where $$\angle \psi_k = \begin{cases} \tan^{-1}\frac{\Im\psi_k}{\Re\psi_k} & \Re\psi_k \geq 0 \\ \pi + \tan^{-1}\frac{\Im\psi_k}{\Re\psi_k} & \text{otherwise} \end{cases} \tag{4}$$

wherein $\Im$ is an imaginary component part of the complex image and R is the real part of the complex image.

Figure 3:
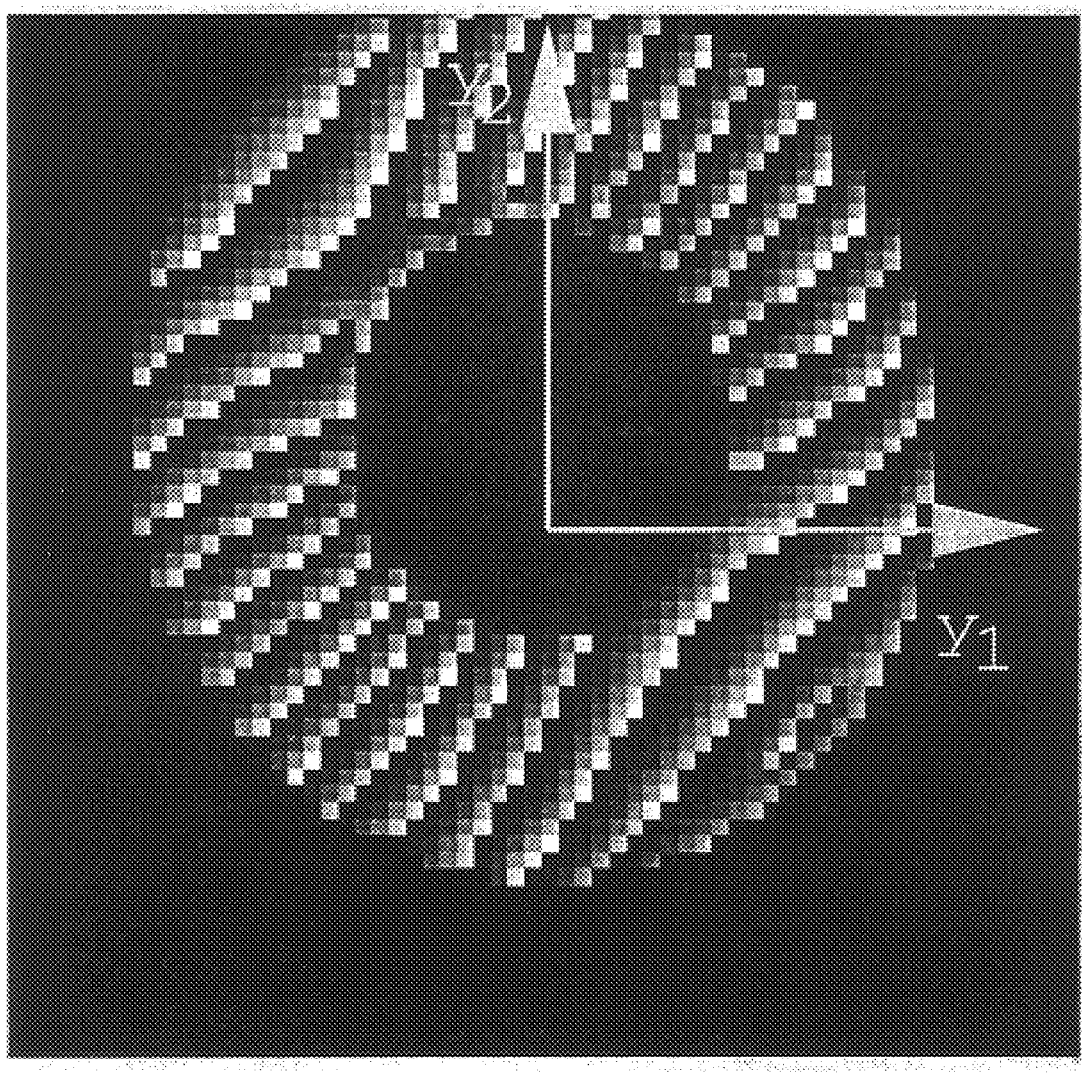
FIG. 3 illustrates the angle of the complex image.

For example, the angle image calculated from the spectral peak circled in FIG. 2 is shown in FIG. 3. The saw-tooth pattern of this image arise as a result of the angle of a complex quantity being wrapped into the range $[-\pi,\pi)$.

The angle images can be the basis for several very useful subsequent analyses. First, the images can be used to produce synthetic tags similar to the usual planar tags in tagged MRI images. The advantage of this feature is that the data is generated entirely automatically, and can be generated with any desired tag separation. Second, the images can be used directly to compute the small displacements of an object. Third, angle images can be used to directly compute planar strain in 2D image plane, or a full 3D strain tensor in 3D. These strain data are useful in the detection and quantification of myocardial ischemia and infarction. Fourth, the angle images can be used to form standard optical flow fields representing a time series of displacement fields.

Figure 4:
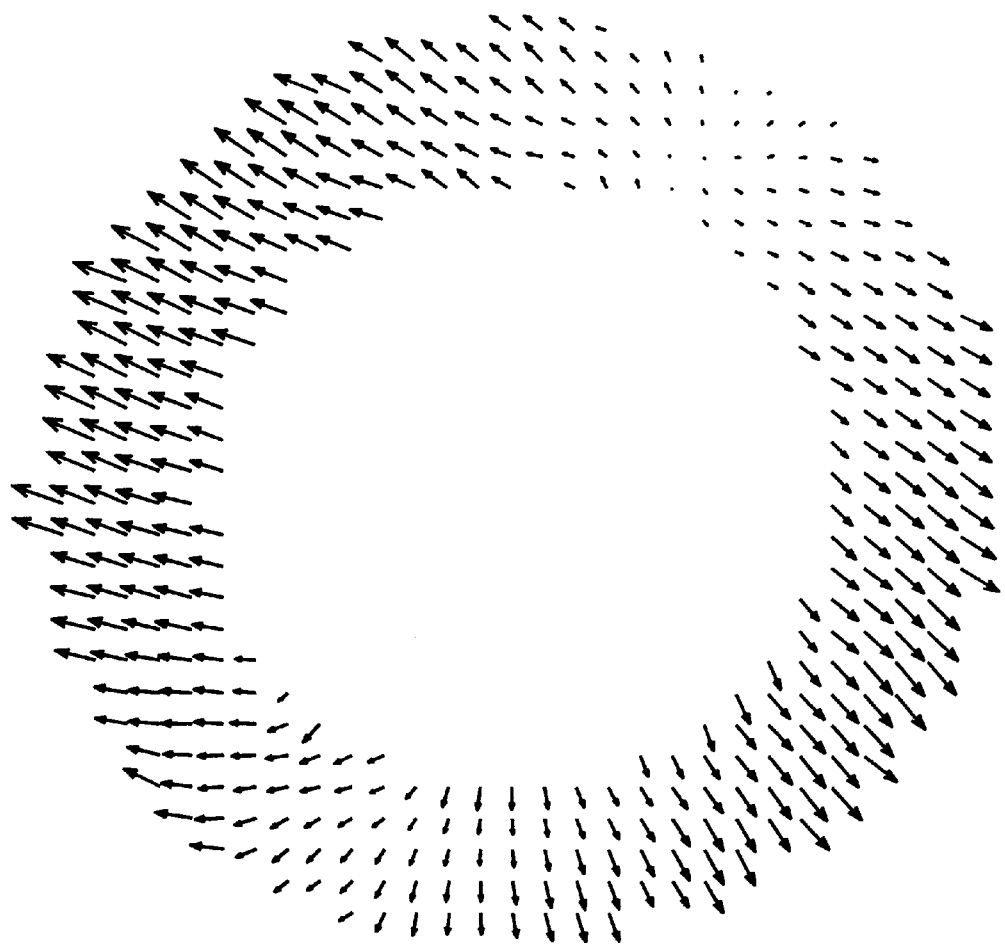
FIGS. 4 and 5 illustrate, respectively, (a) computed displacement of a point on the object and (b) with actual displacement.
Figure 5:
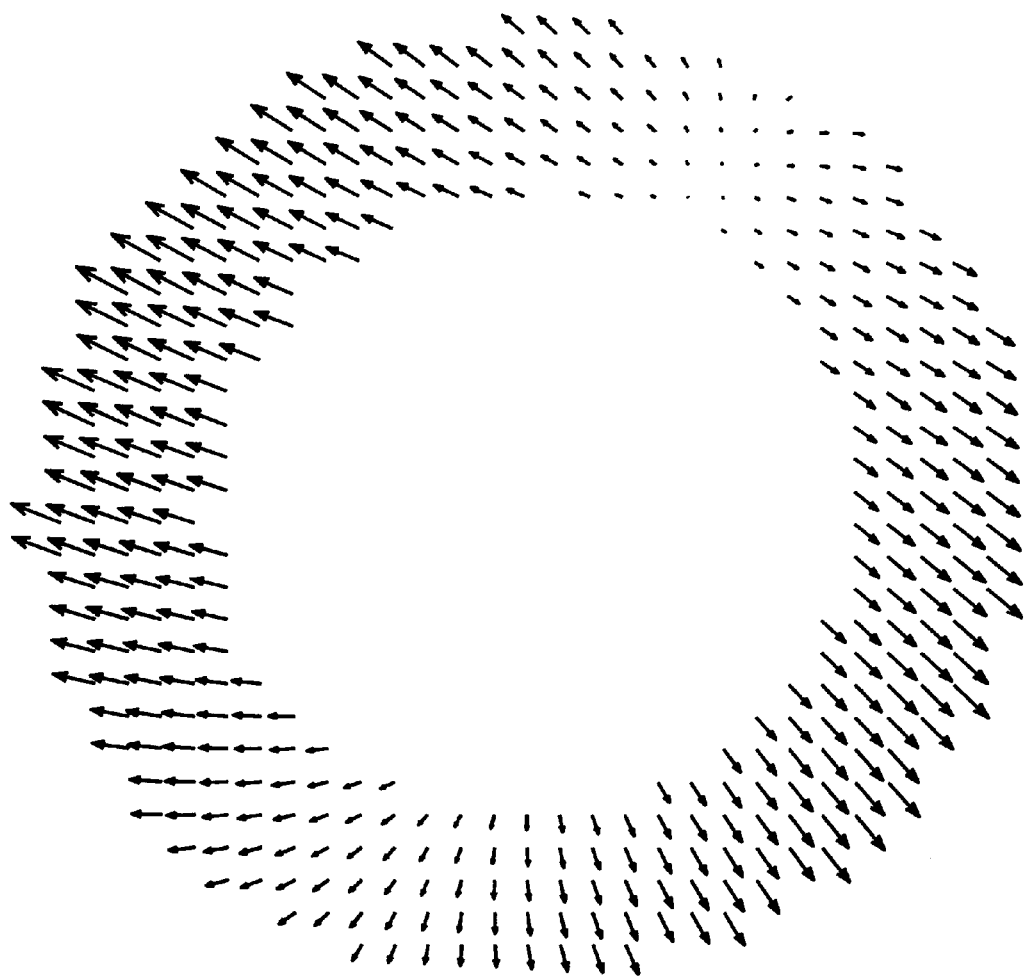

FIGS. 4 and 5 show the computed displacement and actual displacement, respectively, for a small displacement. The similarity between the computed and true displacement fields show that the motion of the angle images is effective to reconstruct the motion.

For synthetic tag lines of an image, a single angle image $a_k(y,t)$ can be employed. A tag line is a collection of points $\{y^*\}$ that satisfy $$a_k(y^*,t)=a \tag{5}$$

Figure 6:
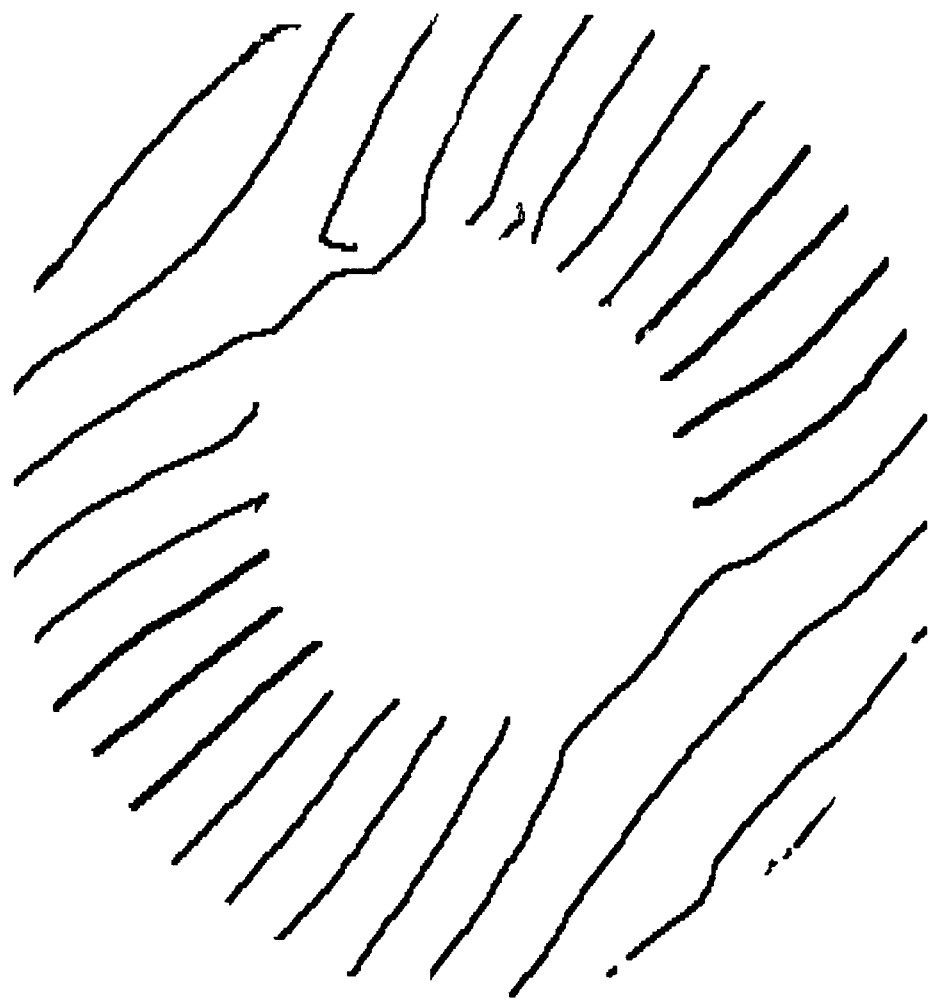
FIG. 6 illustrates computed displacement tag lines generated from the angle image shown in FIG. 3.

FIG. 6 shows tag lines generated from the angle image in FIG. 3. There are several advantages in using angle images to generate synthetic tag lines. First, it is a completely automatic process. Second, the tag lines will have subpixel resolution as good isocontour algorithms have this property. Third, the entire image will have these tags automatically identified, including, for example, both the left and right ventricular myocardium. Finally, by selecting N values in the range $[-\pi,\pi)$, N tag lines will be synthesized within over the spatial period $2\pi/|w_k|$. In principle, there is no fundamental limit on how closely these tag lines can be spaced, because they are not limited by the detectability of features spaced close together.

For small deformations, two angle images ($a_k$ and $a_l$) of two linearly independent vectors $w_k$ and $w_l$ that lie in the imaging plane can be used to compute the projection of the displacement field ($u_2$) on the image plane at t using $$u_2(y, t) = (W^T H)^{-1} \begin{bmatrix} \Delta a_k(y, t) \\ \Delta a_l(y, t) \end{bmatrix} \quad (6)$$

wherein W is the matrix and $^T$ is the transposition of the matrix and $\Delta a_k$ is computed by $$\Delta a_k(y,t) = W[w_k^T x(y) + \theta_k - a_k(y,y)] \quad (7)$$

$\theta_k$ is a known angle determined from the pulse sequence and W is the nonlinear wrapping function given by $$W(\theta) = \mod(\theta + \pi, 2\pi) - \pi. \quad (8)$$

and the function x(y) maps any point y in the image plane coordinates system to its position $x \in IR^3$ in the magnets 3D coordinates system using $$x(y) = y_1 h_1 + y_2 h_2 + x_0 = Hy + x_0 \quad (9)$$

where the matrix $H \in IR^{3 \times 2} = [h_2 h_2]$, and the vectors $h_1 \in IR^3$ represent the readout and phase-encoding directions, respectively, of the image plane; and $x_0 \in IR_3$ is the image origin. The matrix $W \in IR^{3 \times 2} = [w_1 w_2]$.

There are a number of ways to minimize the magnitude of motion being monitored to facilitate the method of the present invention being practiced on relatively small movements. One way, for example, is to image very shortly after end-diastole, before the heart has had a chance to move substantially. This approach will be useful and potentially clinically important in the first few tens of milliseconds of systole. Secondly, if low-frequency tag patterns are used, the physical period of the tag pattern is larger and larger motions will not produce angle ambiguity (wrapping). A potential difficulty with this option is that the spectral peaks of low-frequency patterns may interfere with another leading to undesired motion artifacts. A third approach would be to apply the tag pattern at a fixed offset from end-diastole and image shortly thereafter. In this case, the application of the tag pattern to rapidly-moving tissue is required. Finally, a way to circumvent this problem is to image the displacement between image times rather than the displacement from the time of tagging. These displacements would be small. This approach is classically called "optical flow."

The strain is related to the difference in displacement between adjacent parts of tissue. This can be directly computed from at least two angle images ($a_k$ and $a_l$) of two linearly independent vectors $w_k$ and $w_l$. Planar strain in the direction e is computed by $$\epsilon_2(y, t; e) = \left\| (W^T H)^{-1} \begin{bmatrix} \nabla_y a_k^*(y, t) \\ \nabla_y a_l^*(y, t) \end{bmatrix} e \right\| - 1 \quad (10)$$

where $$\nabla_y a_k^* = \begin{cases} \nabla_y a_k & \|\nabla_y a_k\| \le \|\nabla_y a_k^{(\pi)}\| \\ \nabla_y a_k^{(\pi)} & \text{otherwise} \end{cases} \quad (11)$$

and $$a_k^{(\pi)}(y,t) = W(a(y,t) + \pi) \quad (12)$$

and similar equations for $\Delta^y_1 a^*$. The last two equations are used to overcome the wrapping discontinuity while computing the derivatives of the angle images. The strain computed from these equations is in the Eulerian sense. A fall strain tensor can be computed from three angle images coming from three spectral peaks. The generation of the three spectral peaks is done by using 3D SPAMM pattern and acquiring an image volume rather than an image plane.

Optical flow is defmed as the apparent motion of brightness patterns in an image sequence. See, generally, E. C. Hildreth, Measurement of Visual Motion, MIT Press, Cambridge, 1984. In the present context, the word "apparent" implies motion with the image plane instead of true 3D motion. In the prior art context, the definition of optical flow involves velocity fields, and generally some sort of regularization is required in order to get a dense estimate of this velocity field. See, generally, Horn et al., Determining Optical Flow, Artificial Intelligence, 17:185–203, 1981. The usage of angle images within the context of the present invention, permits direct calculation of a velocity field without requiring the use of regularization.

For applying the angle images to optical flow methods, at least four angle images $a_k(y,t)$, $a_l(y,t)$, $a_k(y,t+\Delta t)$, and $a_l(y, t+\Delta t)$ with linearly independent vectors $w_k$ and $w_1$, may be employed. The time interval between two images $\Delta t > 0$ is preferably small enough for the assumption of constant motion velocity $v_2$ during the time interval. The planar motion velocity is computed by $$v_2(y, t) = \frac{-1}{\Delta t} \begin{bmatrix} \nabla_y a_k^*(y, t + \Delta t) \\ \nabla_y a_l^*(y, t + \Delta t) \end{bmatrix}^{-1} \begin{bmatrix} \Delta_t a_k(y) \\ \Delta_t a_l(y) \end{bmatrix} \quad (13)$$

where $$\Delta_t a_k(y) = W[a_k(y,t+\Delta t) - a_k(y,t)] \quad (14)$$

Referring to FIGS. 7a and 7b, FIG. 7a is a cross-section showing the left ventricle with 1-1 SPAMM tags. FIG. 7b shows the angle image created by the methods of the present invention of the left ventricular cross-section of FIG. 7a.

While for purposes of simplicity of disclosure, specific reference has been made to medical applications of the methods of the invention, the method is not so limited and may be employed in a wide variety of industrial and other uses.

Whereas, particular embodiments of the invention have been described herein for purposes of illustration, it will be evident to those skilled in the art that numerous variations of the details may be made without departing from the invention as defined in the appended claims.

What is claimed is:

1. A method of measuring motion of an object by magnetic resonance imaging comprising
    applying a magnetic resonance imaging pulse sequence to spatially modulate a region of interest of said object,
    acquiring at least one spectral peak from the Fourier domain of said spatially modulated object,
    computing the inverse Fourier transform information of said acquired spectral peaks,
    computing angle images from said spectral peaks, and
    employing said angle images to measure motion of said object.

2. The method of claim 1 including
    modulation of magnetization employing a SPAMM (spatial modulation of magnetization) pulse sequence as said pulse sequence.

3. The method of claim 2 including
    employing as said spectral peaks regions of said Fourier domain wherein energy is concentrated by modulation properties of said SPAMM pulse sequence.

4. The method of claim 3 including employing magnetic resonance imaging pulse sequences selected from the group consisting of gradient echo, echo planar, spin echo, and spiral.

5. The method of claim 2 including computing first and second angle images from said spectral peaks.

6. The method of claim 5 including employing said first and second angle images to measure two-dimensional strain in said object.

7. The method of claim 6 including computing said two-dimensional strain from measured local frequency of two tag directions.

8. The method of claim 2 including computing first, second and third angle images from said spectral peaks.

9. The method of claim 8 including employing said first, second and third angle images to measure three-dimensional strain.

10. The method of claim 1 including employing bandpass filter means to separate said spectral peaks which will be employed in computing said angle images.

11. The method of claim 10 including extracting each said spectral peak used in computing said angle images by a separate bandpass filter.

12. The method of claim 1 wherein said magnetic resonance imaging pulse sequence provides two-dimensional images representing magnetic resonance signals from an image plane in said object.

13. The method of claim 1 wherein said magnetic resonance imaging pulse sequence provides three-dimensional images representing magnetic resonance signals from a volume within said object.

14. The method of claim 1 including acquiring said spectral peaks by scanning regions of the Fourier domain that include said spectral peaks and applying bandpass filters to separate said spectral peaks.

15. The method of claim 14 wherein said Fourier domain is a two-dimensional Fourier domain corresponding to a two-dimensional image plane in said object.

16. The method of claim 14 wherein said Fourier domain is a three-dimensional Fourier domain corresponding to a volume within said object.

17. The method of claim 1 including employing a patient's heart wall as said object.

18. The method of claim 17 including acquiring three said angle images, and employing said method to determine a three-dimensional strain tensor in said heart wall.

19. The method of claim 18 including employing said method on a complex image $\psi_k$ wherein $$\psi_k(y,t) = D_k(y,t)e^{j\Phi_k(y,t)}, k=-K, \ldots, K$$

wherein $D_k$ is the magnitude and $\Phi$ is the phase, y is an image coordinate, t is a time reference with $\psi_k$ having been isolated from $\psi$ and the angle image being determined from $\psi_k$ employing $$a_k(y,t) = \angle \psi_k(y,t), k=-K, \ldots, K$$

k is a whole number, $$\angle \psi_k = \begin{cases} \tan^{-1} \frac{\Im\psi_k}{R\psi_k} & R\psi_k \geq 0 \\ \pi + \tan^{-1} \frac{\Im\psi_k}{R\psi_k} & \text{otherwise} \end{cases}$$

wherein $\Im$ is an imaginary component part of the complex image and R is the real part of the complex image.

20. The method of claim 1 including extracting each said spectral peak by a separate bandpass filter.

21. The method of claim 1 including extracting each said spectral peak by performing a magnetic resonance acquisition cycle.

22. The method of claim 1 including employing said method on a moving heart, and employing said method in an effort to detect and quantify at least one condition selected from the group consisting of myocardial ischemia and myocardial infarction.

23. The method of claim 1 including computing said angle images automatically.

24. The method of claim 1 including employing said method to compute optical flow displacement between successive image frames.

25. The method of claim 1 including employing said angle images to create synthetic tag lines.

26. The method of claim 1 including employing a moving human heart as said object, and employing said method to obtain information about the motion of the heart muscle within its walls.

27. The method of claim 1 including employing said method on at least one object selected from the group consisting of a patient's heart wall, tendons, muscles, blood and cerebrospinal fluid.

28. The method of claim 1 wherein said computing the angle images is by calculating the angle of complex images computed from said inverse Fourier transform of the said acquired spectral peaks.

29. The method of claim 28 wherein said complex images are said inverse Fourier transform of said acquired spectral peaks.

30. The method of claim 28 wherein said complex images are the mathematical combination of more than one said inverse Fourier transform of the said acquired spectral peaks.

31. The method of claim 28 wherein said complex images are the mathematical combination of the inverse Fourier transform of said acquired spectral peaks with some other quantity.

32. The method of claim 1 including displaying said angle images.

33. The method of claim 32 including said measurement of motion including marking material points employing the value of said angle images.

34. The method of claim 33 including said marking employs isocontours to synthesize tag pattern in image planes.

35. The method of claim 33 including said marking employs isocontours to synthesize planar tag surfaces in volume.

36. The method of claim 1, including employing said method on a patient.

* * * * *